United States Patent
Lai et al.

(10) Patent No.: US 10,373,963 B2
(45) Date of Patent: Aug. 6, 2019

(54) METHOD FOR FABRICATING A LOCAL INTERCONNECT IN A SEMICONDUCTOR DEVICE

(71) Applicant: TAIWAN SEMICONDUCTOR MANUFACTURING CO., LTD., Hsinchu (TW)

(72) Inventors: Jui-Yao Lai, Changhwa (TW); Sai-Hooi Yeong, Zhubei (TW); Yen-Ming Chen, Chu-Pei (TW); Ying-Yan Chen, Hsinchu (TW); Jeng-Ya David Yeh, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/986,312

(22) Filed: May 22, 2018

(65) Prior Publication Data
US 2018/0269213 A1    Sep. 20, 2018

Related U.S. Application Data

(62) Division of application No. 14/958,769, filed on Dec. 3, 2015, now Pat. No. 9,997,522.

(51) Int. Cl.
*H01L 21/768* (2006.01)
*H01L 27/11* (2006.01)
(Continued)

(52) U.S. Cl.
CPC .... *H01L 27/1104* (2013.01); *H01L 21/02164* (2013.01); *H01L 21/31051* (2013.01);
(Continued)

(58) Field of Classification Search
None
See application file for complete search history.

(56) References Cited

U.S. PATENT DOCUMENTS

| 4,753,897 A | 6/1988 | Lund et al. |
| 5,953,614 A | 9/1999 | Liu et al. |
| (Continued) | | |

FOREIGN PATENT DOCUMENTS

| CN | 103383964 A | 11/2013 |
| KR | 10-2015-0131914 A | 11/2015 |

OTHER PUBLICATIONS

Office Action Korean Patent Application No. 10-2016-0029494 dated Apr. 18, 2017.
(Continued)

*Primary Examiner* — Chandra Chaudhari
(74) *Attorney, Agent, or Firm* — McDermott Will & Emery LLP

(57) ABSTRACT

A semiconductor device comprises a first gate electrode disposed on a substrate, a first source/drain region, and a local interconnect connecting the first gate electrode and the first source/drain region. The local interconnect is disposed between the substrate and a first metal wiring layer in which a power supply line is disposed. The local interconnect has a key hole shape in a plan view, and has a head portion, a neck portion and a body portion connected to the head portion via the neck portion. The neck portion is disposed over the first gate electrode and the body portion is disposed over the first source/drain region.

20 Claims, 12 Drawing Sheets

(51) Int. Cl.
  *H01L 21/02* (2006.01)
  *H01L 21/3105* (2006.01)
  *H01L 21/8234* (2006.01)
  *H01L 23/535* (2006.01)
  *H01L 27/088* (2006.01)
  *H01L 29/66* (2006.01)
  *H01L 29/78* (2006.01)
  *H01L 29/417* (2006.01)

(52) U.S. Cl.
  CPC .. *H01L 21/76834* (2013.01); *H01L 21/76877* (2013.01); *H01L 21/76895* (2013.01); *H01L 21/76897* (2013.01); *H01L 21/823437* (2013.01); *H01L 21/823475* (2013.01); *H01L 23/535* (2013.01); *H01L 27/088* (2013.01); *H01L 29/6653* (2013.01); *H01L 29/785* (2013.01); *H01L 29/41783* (2013.01); *H01L 29/66545* (2013.01)

(56) References Cited

U.S. PATENT DOCUMENTS

| | | | |
|---|---|---|---|
| 6,300,683 B1 | 10/2001 | Nagasaka et al. | |
| 8,900,934 B2 * | 12/2014 | Adam | H01L 29/66795 257/347 |
| 9,876,016 B2 * | 1/2018 | Steigerwald | H01L 21/76897 |
| 2004/0259306 A1 | 12/2004 | Sakai et al. | |
| 2006/0046449 A1 | 3/2006 | Liaw | |
| 2009/0014796 A1 | 1/2009 | Liaw | |
| 2012/0211843 A1 | 8/2012 | Jung et al. | |
| 2015/0187905 A1 | 7/2015 | Cai et al. | |
| 2015/0194432 A1 | 7/2015 | Lee | |
| 2015/0333073 A1 | 11/2015 | Chang et al. | |
| 2016/0005851 A1 | 1/2016 | Song et al. | |
| 2017/0077106 A1 | 3/2017 | Liaw | |

OTHER PUBLICATIONS

Office Action dated Jul. 11, 2017 issued in Taiwanese Patent Application No. 105125903.

Non-Final Action issued in U.S. Appl. No. 14/958,769, dated Oct. 28, 2016.

Final Action issued in U.S. Appl. No. 14/958,769, dated Feb. 16, 2017.

Non-Final Action issued in U.S. Appl. No. 14/958,769, dated May 30, 2017.

Final Action issued in U.S. Appl. No. 14/958,769, dated Oct. 10, 2017.

Notice of Allowance issued in U.S. Appl. No. 14/958,769, dated Jan. 18, 2018.

* cited by examiner

US 10,373,963 B2

METHOD FOR FABRICATING A LOCAL INTERCONNECT IN A SEMICONDUCTOR DEVICE

CROSS-REFERENCE TO RELATED APPLICATIONS

This application is a Divisional Application of U.S. Ser. No. 14/958,769, filed Dec. 3, 2015. The disclosure of which is incorporated herein by reference in entirety.

TECHNICAL FIELD

The disclosure relates to a method for manufacturing a semiconductor device, and more particularly to a structure and a manufacturing method for a local interconnect connecting a gate electrode and a source/drain region.

BACKGROUND

With a decrease of dimensions of semiconductor devices with a complex layout structure, a local interconnect that connects a source/drain region to another source/drain region or to a gate electrode has been developed. A local interconnect is a conductive layer disposed below the first metal wiring layer, and connects elements having a relatively short distance. For example, in a static random access memory (SRAM), a local interconnect can be used to connect an output node (source/drain) of one inverter to an input node (gate) of another inverter. It has been required to provide structures and manufacturing processes for a local interconnect with improved process variation resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
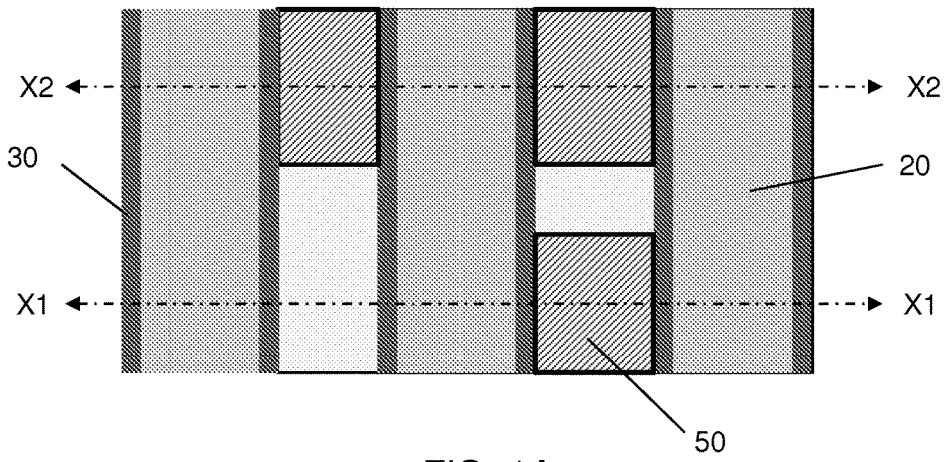
FIGS. 1A-1C and 2A-8C show exemplary views illustrating a sequential fabrication process of a semiconductor device according to one embodiment of the present disclosure.
Figure 1B:
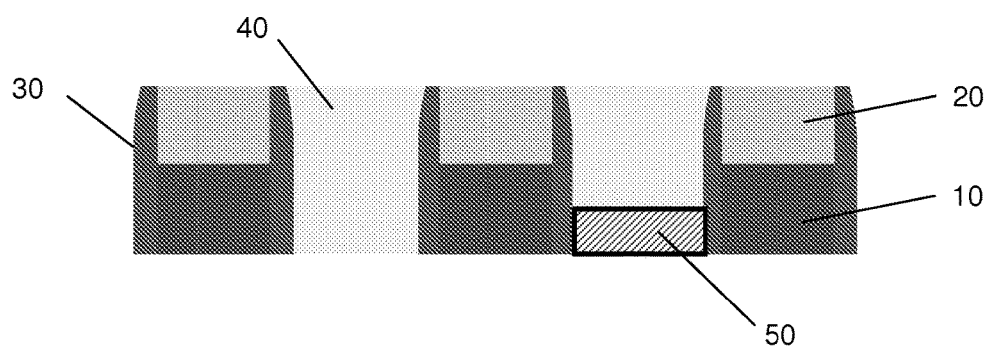
Figure 1C:
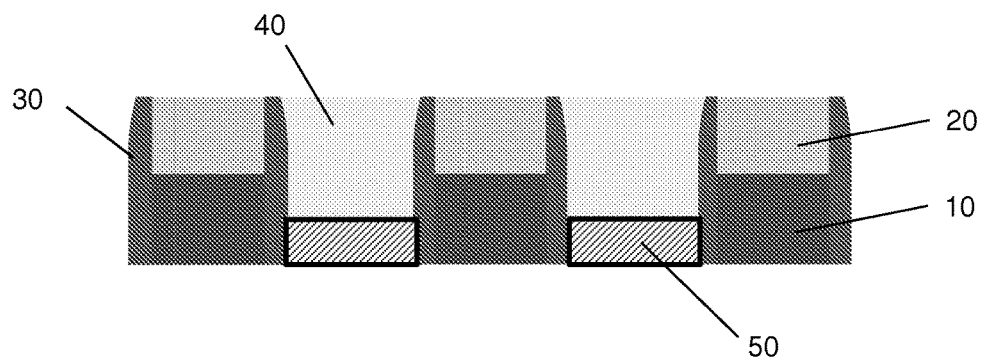

FIGS. 1A-1C show one of the stages of a sequential fabrication process of a semiconductor device according to one embodiment of the present disclosure. FIG. 1A shows a plan (top) view, FIG. 1B shows a cross sectional view along line X1-X1 of FIG. 1A, and FIG. 1C shows a cross sectional view along line X2-X2 of FIG. 1A.

FIGS. 1A-1C show a structure of a semiconductor device after metal gates are formed. In FIGS. 1A-1C, metal gates 10 are formed over a substrate (not shown) and cap insulating layers 20 are disposed over the metal gate 10. The thickness of the metal gates 10 is in a range from 15 nm to 50 nm in some embodiments, and the thickness of the cap insulating layer 20 is in a range from about 15 nm to about 30 nm. Sidewall spacers 30 are provided on sidewalls of metal gates 10 and the cap insulating layer 20. The film thickness of the sidewall spacers 30 at the bottom of the sidewall spacers is in a range from about 5 nm to about 20 nm in some embodiments. The combination of the metal gate 10, the cap insulating layer 20 and sidewall spaces 30 may be collectively referred to as a gate structure. Further, source/drain regions 50 are formed adjacent to the gate structures, and spaces between the gate structures are filled with a first interlayer dielectric (ILD) layer 40.

The metal gate 10 includes one or more layers of metal material, such as Al, Cu, W, Ti, Ta, TiN, TiAl, TiAlC, TiAlN, TaN, NiSi, CoSi, other conductive materials. A gate dielectric layer (not shown) includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers (not shown) are interposed between the gate dielectric layer (not shown) and the metal gate 10. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material such as silicon nitride based material including SiN, SiCN and SiOCN. In this embodiment, SiN is used as the cap insulating layer 20. The sidewall spacer 30 is made of a different material than the cap insulating layer 20 and includes one or more layers of insulating material such as silicon nitride based material including SiN, SiON, SiCN and SiOCN. In this embodiment, SiON, SiCN or SiOCN is used as the sidewall spacers 30. The first ILD layer 40 includes one or more layers of insulating material such as silicon oxide based material such as silicon dioxide ($SiO_2$) and SiON. In this embodiment, $SiO_2$ is used as the first ILD layer 40.

In this embodiment, fin field effect transistors (Fin FETs) fabricated by a gate-replacement process are employed.

Figure 1D:
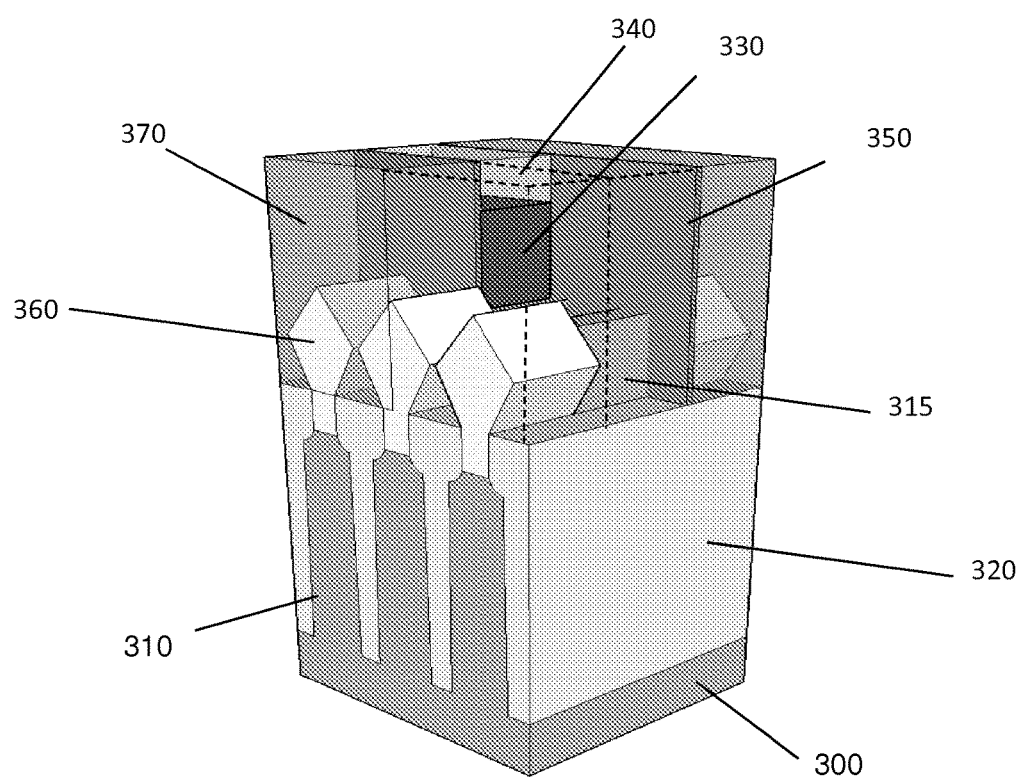
FIG. 1D shows an exemplary perspective view of a Fin FET structure.

FIG. 1D shows an exemplary perspective view of a Fin FET structure.

First, a fin structure 310 is fabricated over a substrate 300. The fin structure includes a bottom region and an upper region as a channel region 315. The substrate is, for example, a p-type silicon substrate with an impurity concentration in a range from about $1 \times 10^{15}$ $cm^{-3}$ to about $1 \times 10^{18}$ $cm^{-3}$. In other embodiments, the substrate is an n-type silicon substrate with an impurity concentration in a range from about $1 \times 10^{15}$ $cm^{-3}$ to about $1 \times 10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluoride-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. After a planarization operation, the dummy gate structure is removed so as to make a gate space. Then, in the gate space, a metal gate structure 330 including a metal gate electrode and a gate dielectric layer, such as a high-k dielectric layer, is formed. Further, the cap insulating layer 340 is formed over the metal gate structure 330, so as to obtain the Fin FET structure shown in FIG. 1D. In FIG. 1D, parts of the metal gate structure 330, the cap isolation layer 340, sidewalls 330 and the ILD 370 are cut to show the underlying structure.

The metal gate structure 330, the cap isolation layer 340, sidewalls 330, source/drain 360 and the ILD 370 of FIG. 1D substantially correspond to the metal gates 10, cap insulating layers 20, sidewall spacers 30, source/drain regions 50 and first interlayer dielectric layer (ILD) 40, of FIGS. 1A-1C, respectively.

Figure 2A:
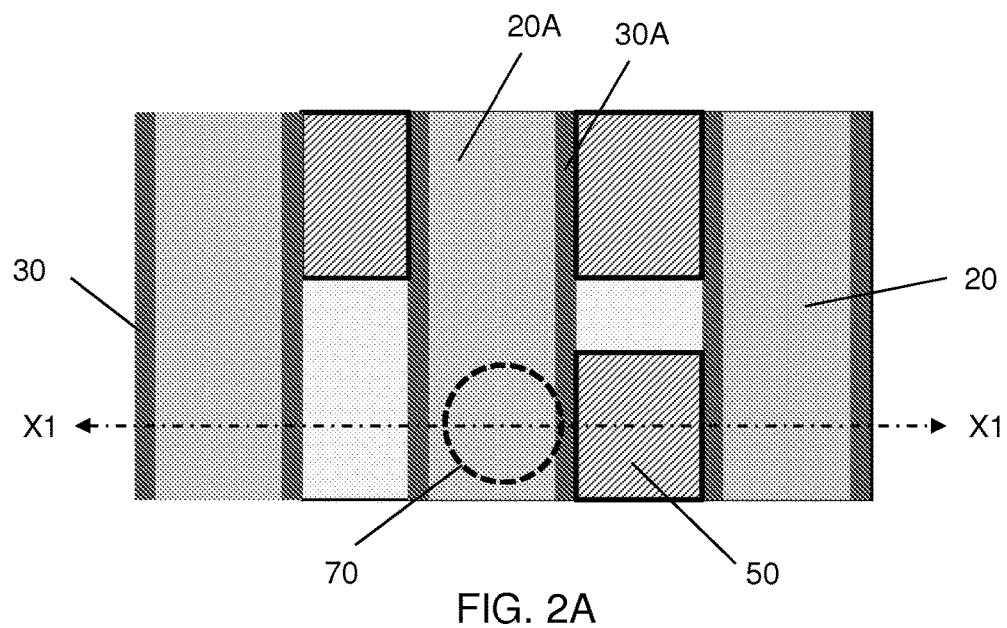
Figure 2B:
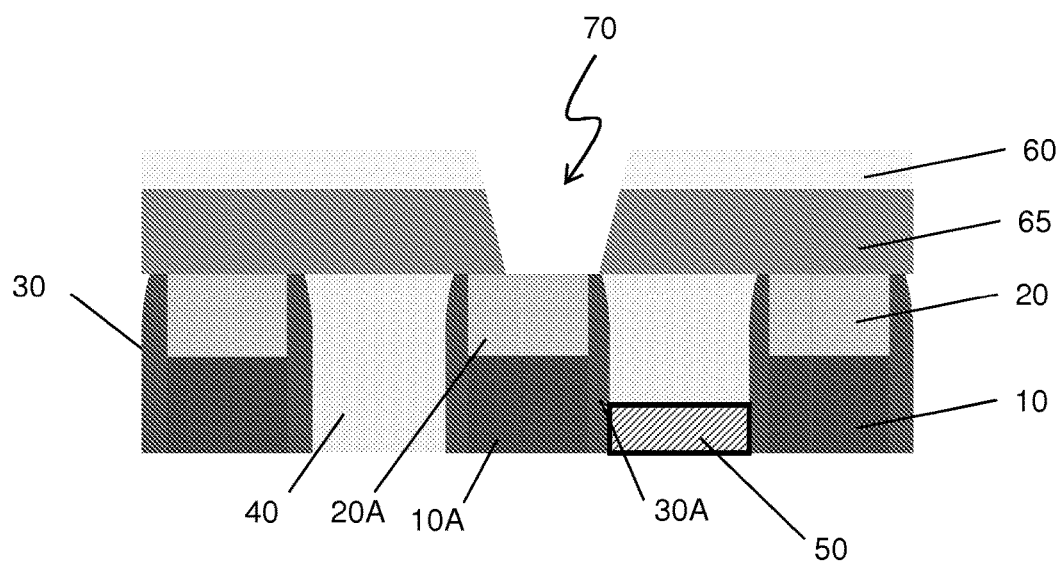

FIGS. 2A and 2B show one of the stages of a sequential fabrication process of a semiconductor device according to one embodiment of the present disclosure. FIG. 2A shows a plan (top) view and FIG. 2B shows a cross sectional view along line X1-X1 of FIG. 2A.

A photo resist layer 60 is formed over the structure of FIGS. 1A-1C with a bottom anti-reflection coating (BARC) layer 65 thereunder. By using a lithography operation, a hole pattern 70 is formed in the photo resist layer 60 and the BARC layer 65, as shown in FIG. 2B. The location of the hole 70 is adjusted such that a part of the cap insulating layer 20A and a part of one of the sidewall spacers 30A adjacent to the source/drain region 50, which is to be connected to the gate 10A, is exposed in the hole 70, as shown in FIG. 2A. It is noted that the photo resist layer 60 and the BARC layer 65 are omitted in FIG. 2A and only the location of the hole 70 is illustrated.

Figure 3A:
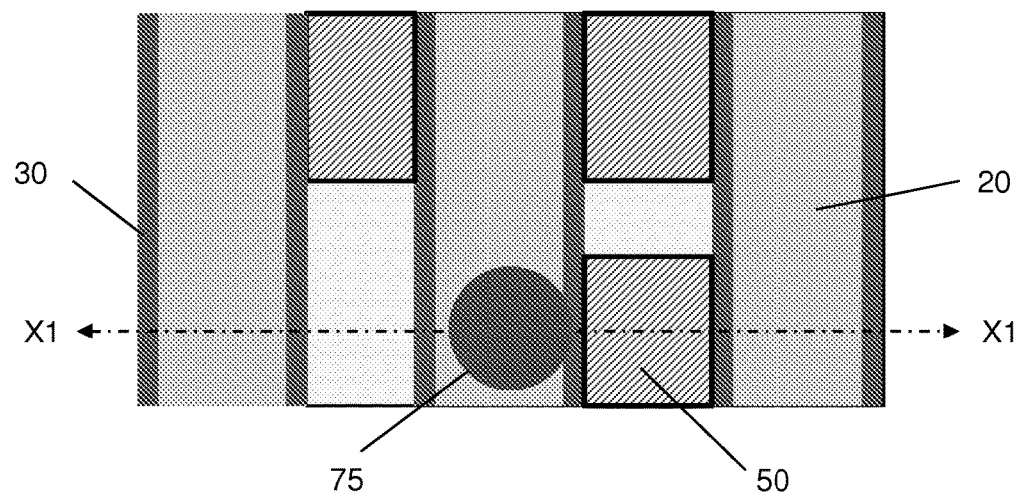
Figure 3B:
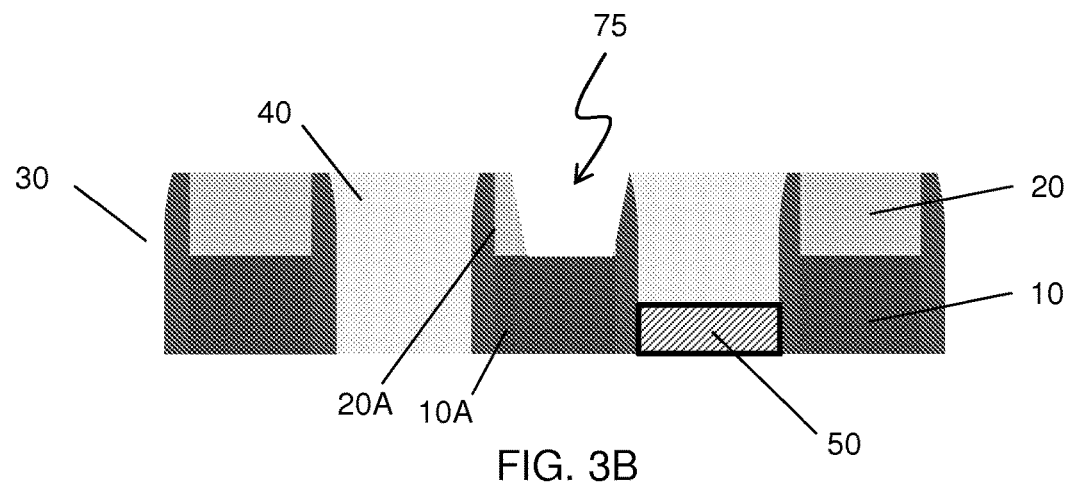

FIGS. 3A and 3B show one of the stages of a sequential fabrication process of a semiconductor device according to one embodiment of the present disclosure. FIG. 3A shows a plan (top) view and FIG. 3B shows a cross sectional view along line X1-X1 of FIG. 3A.

By using the photo resist layer 60 as an etching mask, the part of the cap insulating layer 20A and the part of one of the sidewall spacers 30A is removed to make a space 75, and then the photo resist layer 60 and the BARC layer 65 are removed, as shown in FIG. 3B.

Figure 4A:
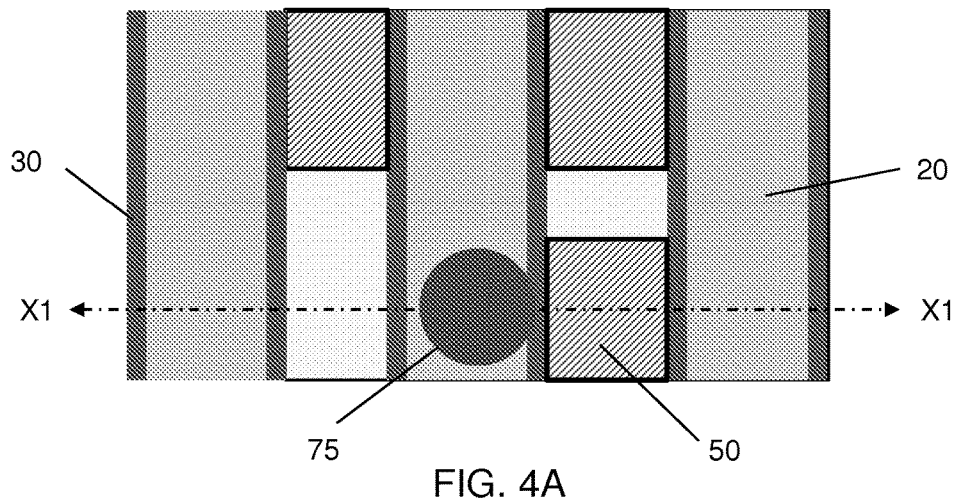
Figure 4B:
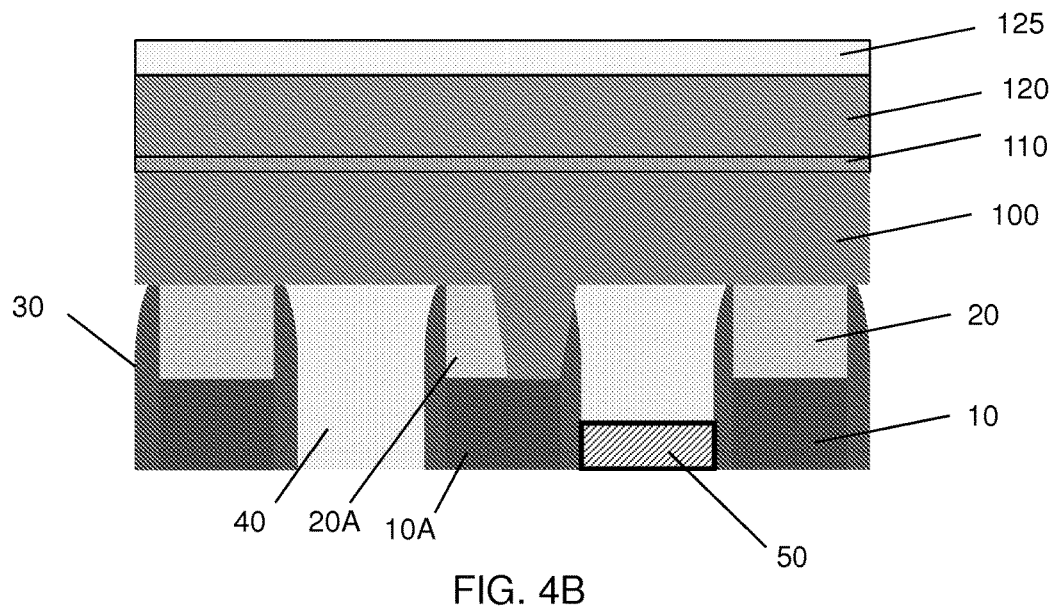

FIGS. 4A and 4B show one of the stages of a sequential fabrication process of a semiconductor device according to one embodiment of the present disclosure. FIG. 4A shows a plan (top) view and FIG. 4B shows a cross sectional view along line X1-X1 of FIG. 4A.

After the etching, a second ILD layer 100 is formed over the etched structure of FIGS. 3A and 3B, and subsequently, a hard mask layer 110, a BARC layer 120 and a photo resist layer 125 are formed over the second ILD layer 100, as shown in FIG. 4B.

The second ILD layer 100 includes one or more layers of insulating material such as silicon oxide based material such as silicon dioxide ($SiO_2$), SiON or low-k dielectric material. The hard mask layer 110 is made of, for example, TaN, TiN, Ti or other suitable material which has a high etching selectivity against silicon oxide. The thicknesses of the second ILD layer 100 and the hard mask layer 110 are in a range from about 15 nm to about 50 nm in some embodiments. It is noted that the second ILD layer 100, the hard mask layer 110, BARC layer 120 and photo resist layer 125 are omitted in FIG. 4A, and an exposed portion 75 of the metal gate 10 is illustrated.

Figure 5A:
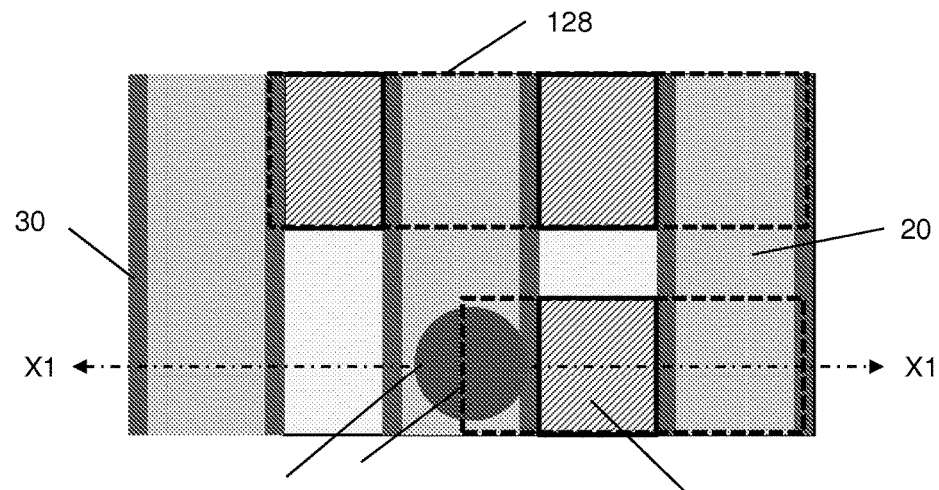
Figure 5B:
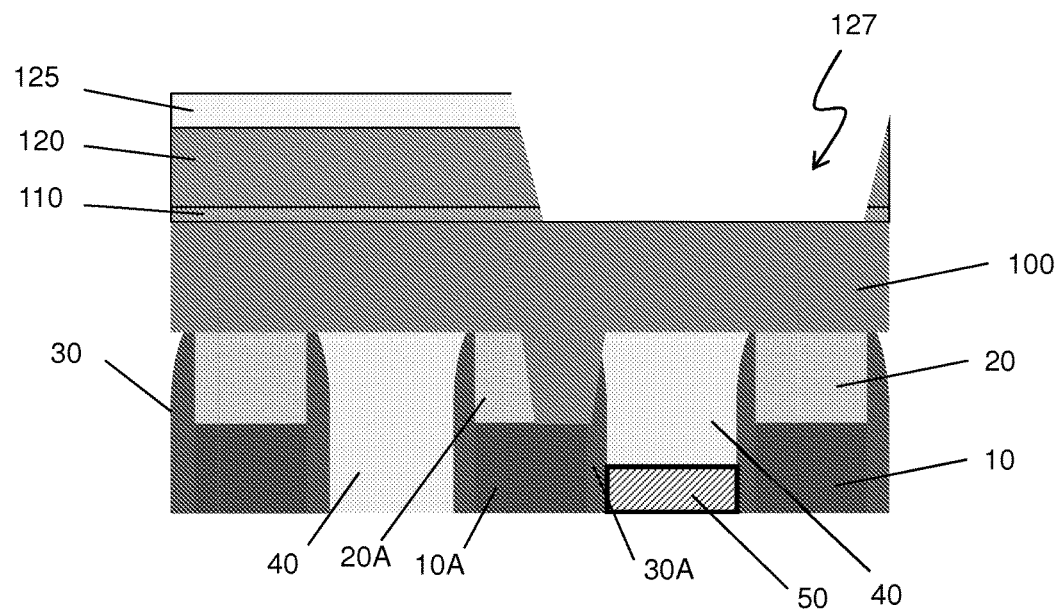

FIGS. 5A and 5B show one of the stages of a sequential fabrication process of a semiconductor device according to one embodiment of the present disclosure. FIG. 5A shows a plan (top) view and FIG. 5B shows a cross sectional view along line X1-X1 of FIG. 5A.

By using a lithography operation, the photo resist layer 125 and the BARC layer 120 are patterned, and the hard mask layer 110 is patterned by using the photo resist layer as an etching mask, thereby forming first and second openings 127 and 128, as shown in FIGS. 5A and 5B. The photo resist layer 125 and the BARC layer 120 are subsequently removed. It is noted that the second ILD layer 100, the hard mask layer 110 and the photo resist layer 125 are omitted in FIG. 5A.

The first opening 127 is formed such that the edge (left edge in FIG. 5A) of the first opening 127 is located to cross the exposed portion 75 of the metal gate, as shown in FIG. 5A, and over the source/drain region 50. The left edge may be located so as to fully cover the exposed portion 75 in a plan view. The right edge of the first opening 127 is not located over the source/drain region 50 and the first ILD layer 40 above the source/drain region 50 and may be located over the adjacent metal gate (or cap isolation layer) or the sidewall spacer. In FIG. 5A, the second opening 128 is formed to overlap two source/drain regions and two gate structures.

Figure 6A:
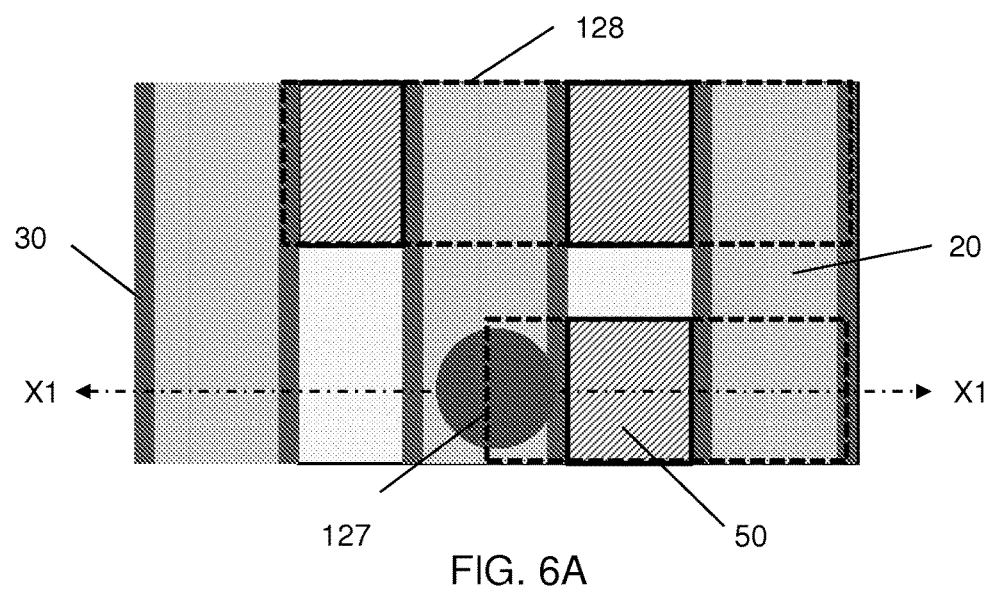
Figure 6B:
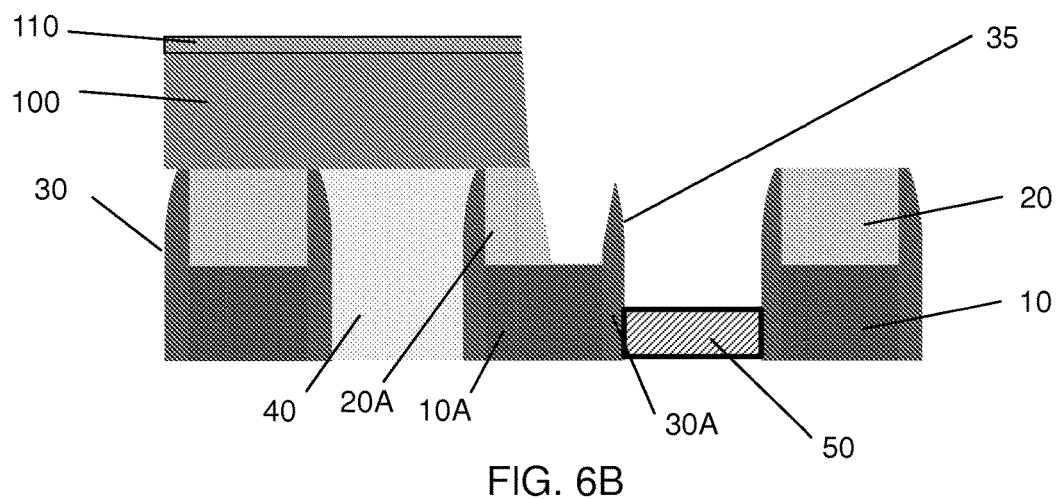

FIGS. 6A and 6B show one of the stages of a sequential fabrication process of a semiconductor device according to one embodiment of the present disclosure. FIG. 6A shows a plan (top) view and FIG. 6B shows a cross sectional view along line X1-X1 of FIG. 6A.

As shown in FIG. 6B, by using the patterned hard mask layer 110 as an etching mask, the second ILD layer 100 and the first ILD layer 40 are removed, so that the upper portion of the metal gate 10A and the upper portion of the source/drain regions 50 are exposed.

Since the cap insulating layer 20 (and 20A) is made of SiN, the ILD oxide etching can be performed with a high selectivity, and the opening 140 can be formed in a substantially self-aligned manner.

In the oxide etching for the first and second ILD layers, the sidewall spacer 30A made of SiN is not etched, and the upper portion 35 of the sidewall spacer remains, as shown in FIG. 6B.

However, since the width (thickness) of the sidewall spacer 30A is less than about 5 nm and the side wall spacer 30A is made of SiON, SiCN or SiOCN, the upper portion 35 of the sidewall spacer is removed during the etching and/or over-etching, without substantially etching the cap insulating layer 20. In other words, the etching process for ILD which includes ion bombardment to result in an anisotropic etching behavior can chop or break the sidewall having a thickness less than 5 nm, even though the material of the sidewall spacers has a lower etching rate than the cap insulating layer.

Figure 7A:
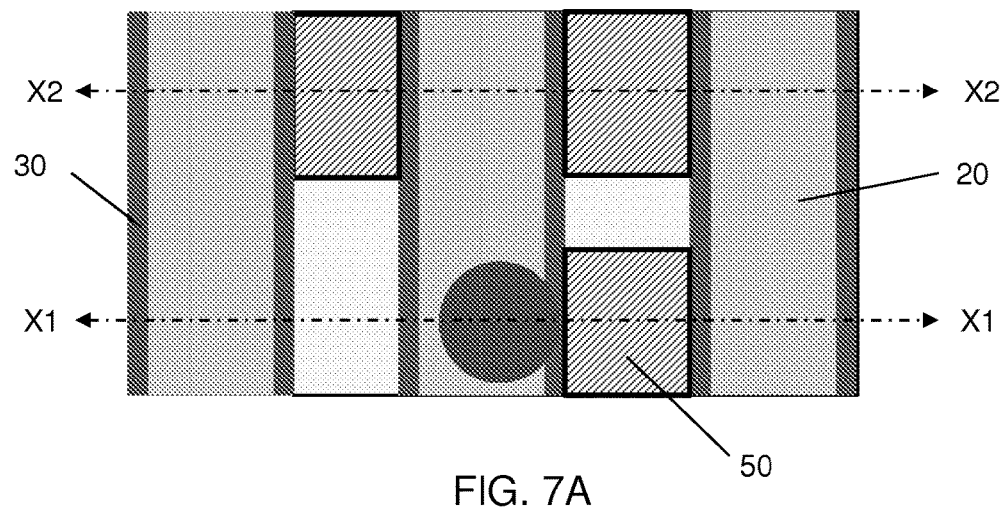
Figure 7B:
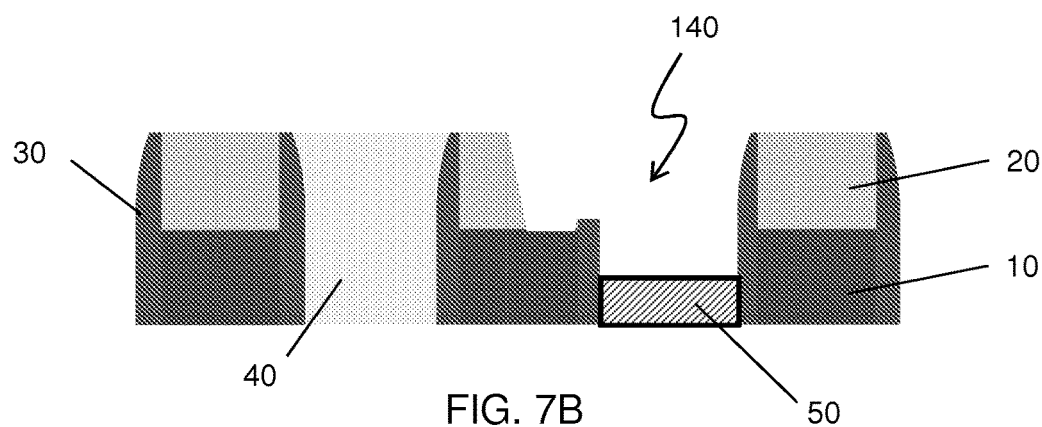
Figure 7C:
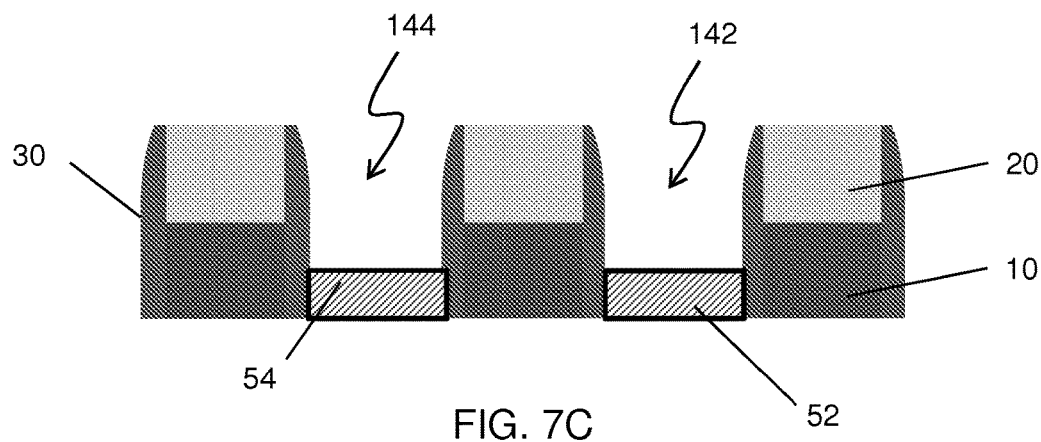

FIGS. 7A-7C show one of the stages of a sequential fabrication process of a semiconductor device according to one embodiment of the present disclosure. FIG. 7A shows a plan (top) view, FIG. 7B shows a cross sectional view along line X1-X1 of FIG. 7A, and FIG. 7C shows a cross sectional view along line X2-X2 of FIG. 7A.

FIGS. 7A-7C show the resultant structure after the ILD oxide etching. Along line X1-X1, an opening 140 is formed and along line X2-X2, openings 142 and 144 are formed.

Figure 8A:
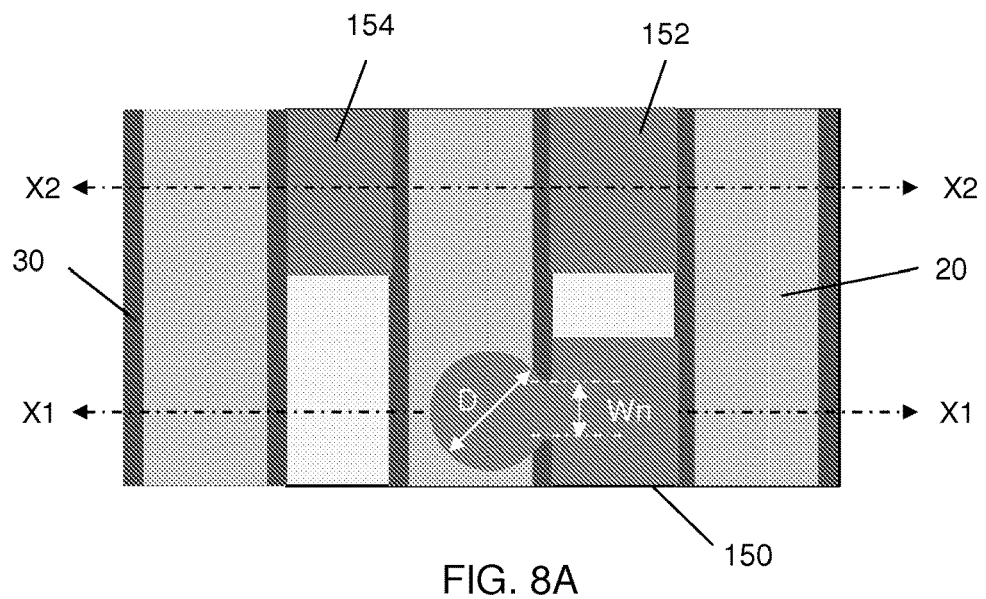
Figure 8B:
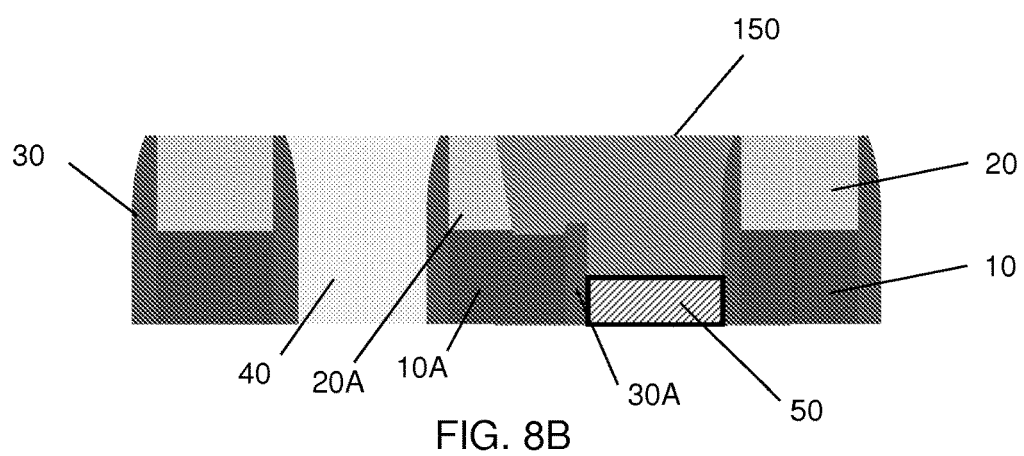
Figure 8C:
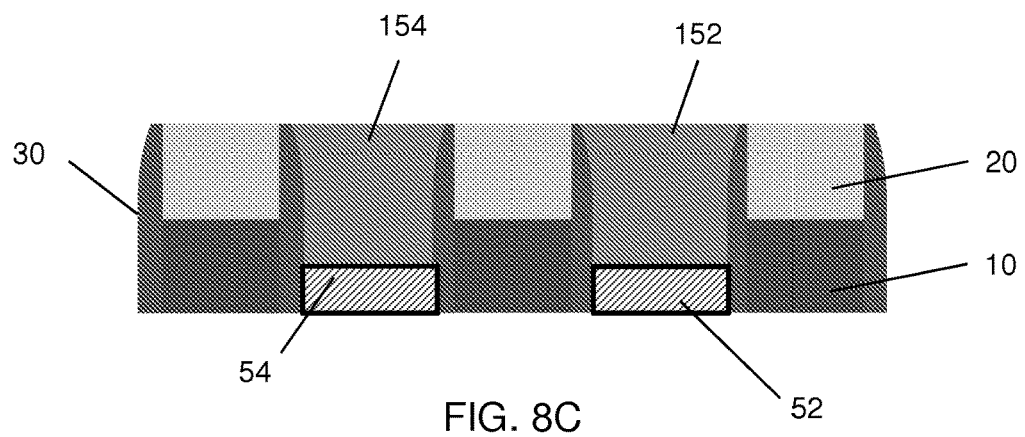

FIGS. 8A-8C show one of the stages of a sequential fabrication process of a semiconductor device according to one embodiment of the present disclosure. FIG. 8A shows a plan (top) view, FIG. 8B shows a cross sectional view along line X1-X1 of FIG. 8A, and FIG. 8C shows a cross sectional view along line X2-X2 of FIG. 8A.

After the openings 140, 142 and 144 are formed, a conductive material is filled in the openings. One or more layers of metal material, such as tungsten, titanium, cobalt and nickel, or silicide thereof, or other suitable materials, are formed over the structure of FIGS. 7A-7C, and a planarization operation, such as a CMP method, is performed, so as to obtain the structure of FIGS. 8A-8C. The space 140 is filled by the metal layer, thereby forming a local interconnect 150 connecting the metal gate 10A and the source/drain region 50. The openings 142 and 144 are also filled by metal layer, thereby forming source/drain contacts 152 and 154, respectively. These source/drain contacts 152 and 154 contact the source/drain regions 52 and 54, respectively. It is noted that upper surfaces of the cap insulating layers 20, upper surfaces (top portion) of the sidewall spacers 30 and upper surfaces of the local interconnect 150 and source/drain contacts 152 and 154 are substantially flush with each other, i.e., on the same plane.

As shown in FIG. 8A, the local interconnect 150 has a "key-hole" shape in a plan (top) view. The "head" portion has a substantially circular shape in a plan view and the diameter D of the "head" portion is in a range from about 10 nm to about 30 nm in some embodiments, and the width Wn of the "neck" portion (connecting portion) is in a range from about 5 nm to about 10 nm in some embodiments. The "body" portion of the key-hole shape is disposed over the source/drain region 50. In other embodiments, the "head" portion has a substantially oval shape in a plan view and the diameter D of the long axis of the oval shape is in a range from about 10 nm to about 30 nm. The head portion is disposed over the metal gate 10 (10A) and the neck portion is disposed over the sidewall spacer 30 (30A). The head portion is in contact with the cap insulating layer 20 (20A).

Figure 9:
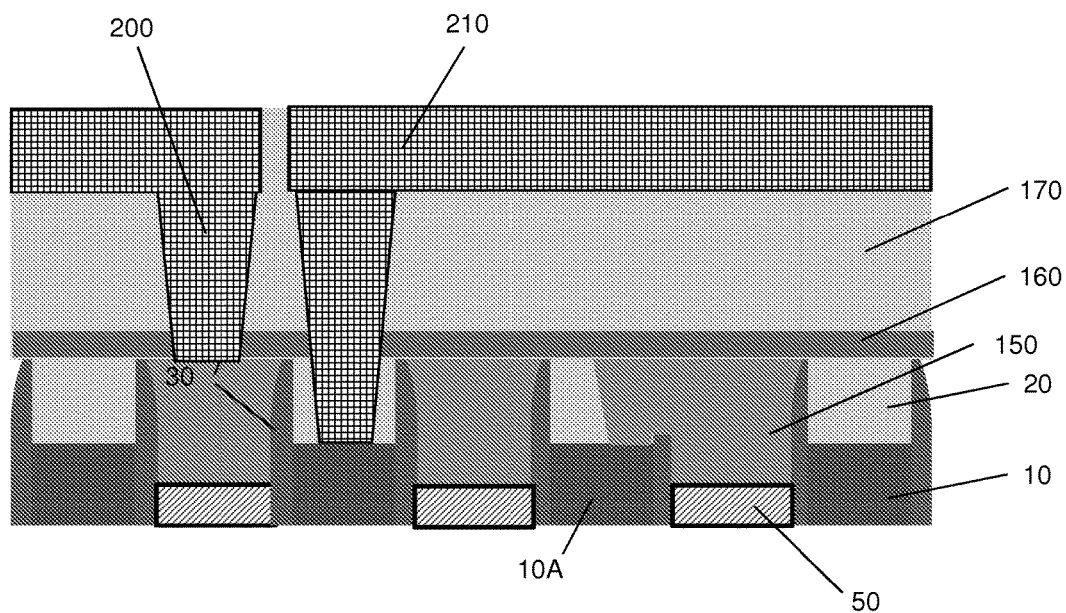
FIG. 9 shows an exemplary cross sectional view of a semiconductor device according to one embodiment of the present disclosure.

FIG. 9 shows an exemplary cross sectional view of a semiconductor device according to one embodiment of the present disclosure.

After the metal layers for the local interconnect 150 and the source/drain contacts 152 and 154 are formed, an etching-stop layer (ESL) 160 and a third ILD layer 170 are formed over the metal layers. Then, a patterning operation is performed to form via holes. The via holes are filed with one or more conductive materials so as to form a via plug 200, and a first metal wiring 210 is formed over the via plug 200. The first metal wiring 210 and the via plug 200 can be formed by a dual damascene method.

Figure 10:
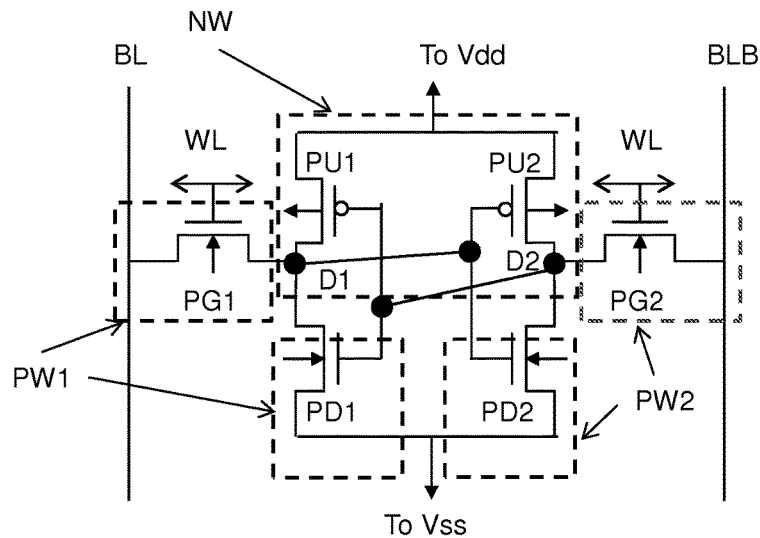
FIGS. 10 and 11 show an exemplary circuit diagram and layout structure of an SRAM according to one embodiment of the present disclosure.
Figure 11:
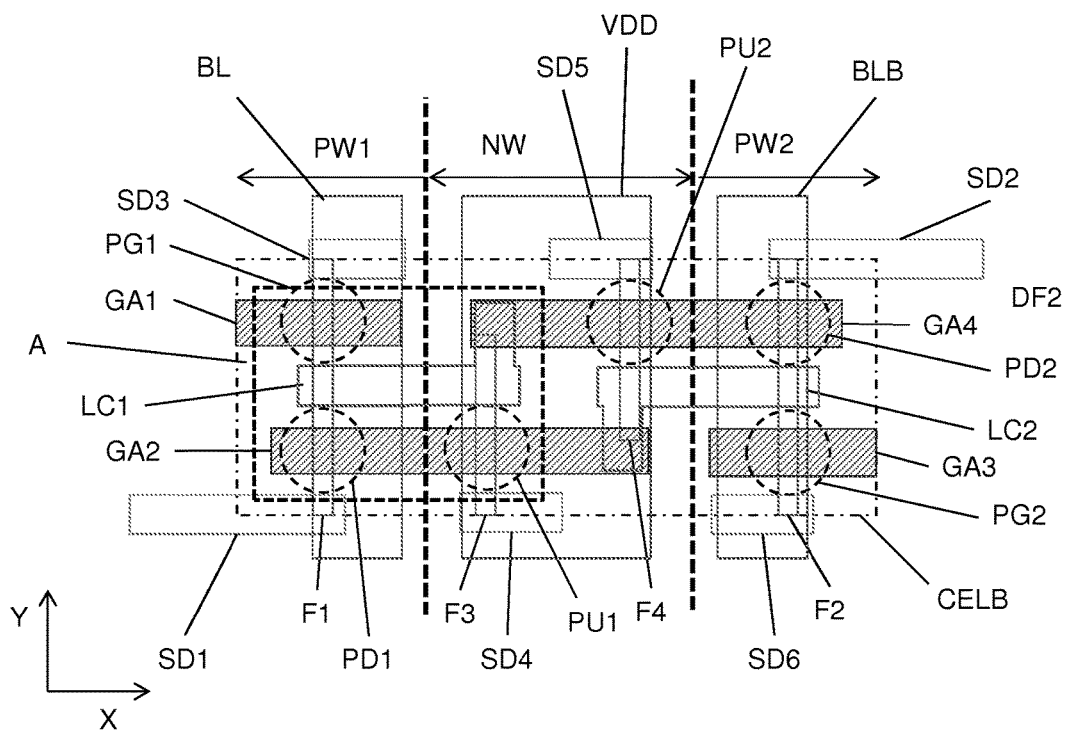

The aforementioned local interconnect structure is applied to an SRAM cell, in some embodiments. FIGS. 10 and 11 show an exemplary circuit diagram and layout structure of an SRAM according to one embodiment of the present disclosure.

An SRAM unit cell includes two cross-coupled inverters having a data storage (output) node D1 and a complementary data storage (output) node D2. The output of the first inverter is coupled to the input of the second inverter, and the output of the second inverter is coupled to the input of the first inverter. The SRAM further includes a first pass-gate FET device PG1 coupled to the output of the first inverter and the input of the second inverter and a second pass-gate FET device PG2 coupled to the output of the second inverter and the input of the first inverter. Gates of the first and second pass-gate FET devices are coupled to a word line WL, a source/drain of the first pass-gate FET device PG1 is coupled to a first bit line BL, and a source/drain of the second pass-gate FET device PG2 is coupled to a second bit line BLB, which is the complement of the first bit line BL. In the present disclosure, a source and a drain of an FET device may be interchangeably used.

The first inverter includes a first first-conductive-type FET device PU1 and a first second-conductive-type FET device PD1. The second inverter includes a second first-conductive-type FET device PU2 and a second second-conductive-type FET device PD2. The first pass-gate device PG1 and the second pass-gate device PG2 are second-conductive type devices. In the first embodiment, the first conductive type is a P-type and the second conductive type is an N-type. Of course, it is possible in another embodiment that the first conductive type is an N-type and the second conductive type is a P-type, and in such a case the remaining elements in the SRAM are appropriately modified according to the common knowledge in the art.

The SRAM further includes a first P-type well PW1, a second P-type well PW2 and an N-type well NW. As shown in FIG. 10, the first pass-gate device PG1 (N-type) and the first N-type FET device PD1 are disposed within the first P-type well PW1, the second pass-gate FET device PG2 (N-type) and the second N-type FET device PD2 are disposed within the second P-type well PW2, and the first P-type FET device PU1 and the second P-type FET device PU2 are disposed within the N-type well NW.

FIG. 11 is an exemplary layout of an SRAM unit cell according to a first embodiment of the present disclosure. In FIG. 11, only some of the lower-layer elements are illustrated.

The SRAM unit cell may be defined by a cell boundary CELB, and includes first to fourth fin structures F1, F2, F3 and F4, each extending in the Y (column) direction and arranged in the X (row) direction. The four fin structures F1, F3, F4 and F2 are arranged in the X direction in this order. The cell boundary CELB has a bottom side extending in the X direction, a top side extending in the X direction and opposing to the bottom side, a left side extending in the Y direction and a right side extending in the Y direction and opposing to the left side.

The SRAM unit cell includes six transistors. The first pass-gate device PG1 is a Fin FET (PG1) formed by a first gate electrode GA1 and the first fin structure F1. The first N-type FET device PD1 is a Fin FET formed by a second gate electrode GA2 and the first fin structure F1. The first P-type FET device PU1 is a Fin FET formed by the second gate electrode GA2 and the third fin structure F3. The second pass-gate FET device PG2 is a Fin FET formed by a third gate electrode GA3 and the second fin structure F2. The second N-type FET device PD2 is a Fin FET formed by a fourth gate electrode GA4 and the second fin structure F2. The second P-type FET device PU2 is a Fin FET formed by the fourth gate electrode GA4 and the fourth fin structure F4.

The SRAM cell further includes a first local interconnect LC1 connecting the sources of the Fin FETs PG1, PD1 and PU1 and the fourth gate electrode GA4, and a second local interconnect LC2 connecting the sources of the Fin FETs PG2, PD2 and PU2 and the second gate electrode GA2. The SRAM cell also includes source/drain contacts SD1, SD2, SD3 and SD4 formed on the drains of the Fin FETs, as shown in FIG. 11. Further, the bit line BL, the complementary bit line BLB and a power (e.g., Vdd) supply line VDD are disposed in the first metal wiring layer over the local interconnects and source/drain contact.

The local interconnect structure 150 shown in FIGS. 8A-9 can be applied in the first local interconnect LC1 to connect the fourth gate GA4 and the source of Fin FET PU1, and in the second local interconnect LC2 to connect the second gate electrode GA2 and the source of the Fin FET PU2.

As shown in FIG. 11, the first local interconnect LC1 connects not only between the source of the Fin FET PU1 and the fourth gate electrode GA4, but also between the source of the Fin FET PU1 and the sources of Fin FETs PG1 and PD1.

Figure 12A:
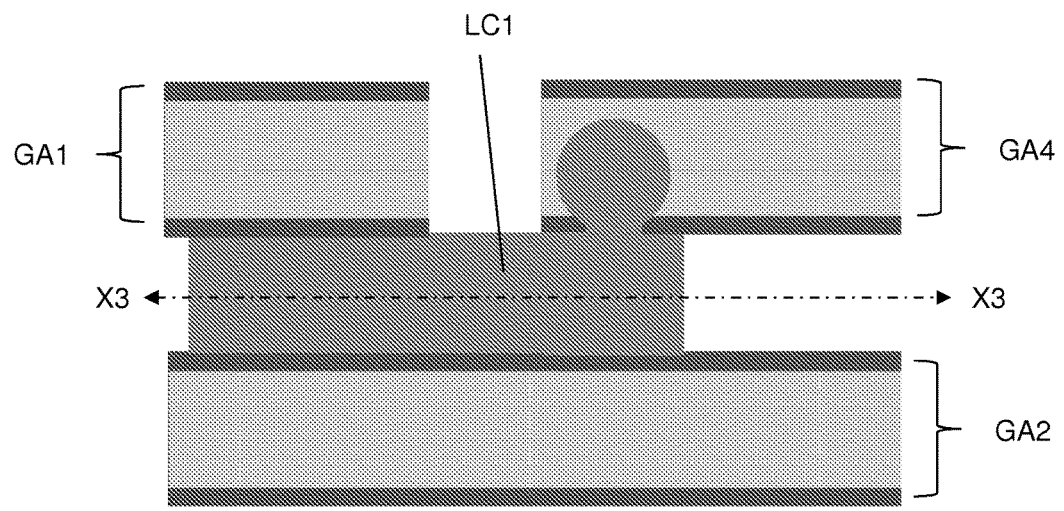
FIG. 12A is an exemplary plan view of the area A shown in FIG. 11
Figure 12B:
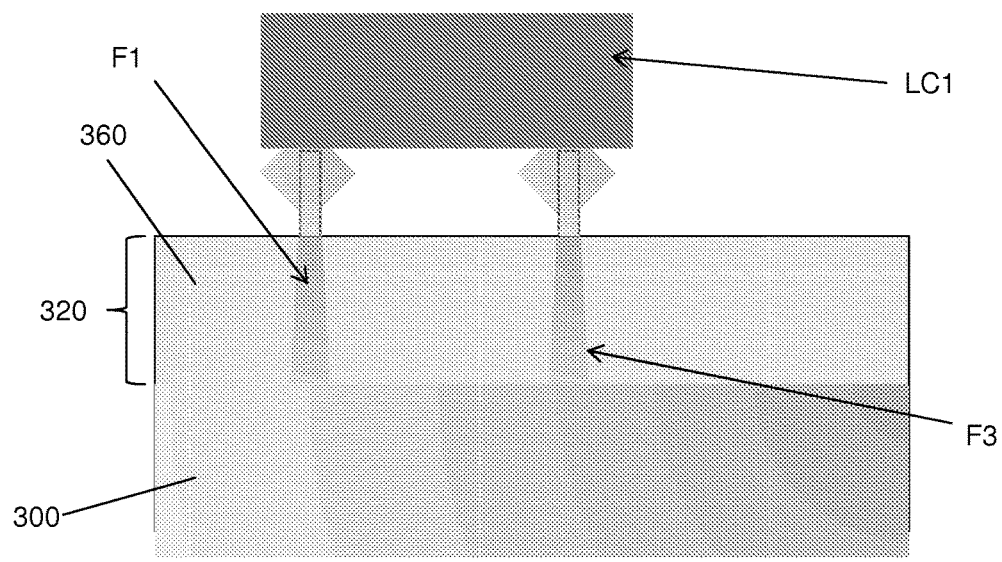
FIG. 12B is an exemplary cross sectional view of line X3-X3 of FIG. 12A according to one embodiment of the present disclosure.

FIG. 12A is an exemplary plan view of the area A shown in FIG. 11 and FIG. 12B is an exemplary cross sectional view of line X3-X3 of FIG. 12A according to one embodiment of the present disclosure.

As shown in FIG. 12A, a part of the first local interconnect LC1, which connects the fourth gate GA4 and the source of the Fin FET PU1, has a key hole shape in a plan view, and has a head portion, a neck portion and a body portion connected to the head portion via the neck portion, similar to FIG. 8A. The head portion is disposed over the fourth gate GA4, the neck portion is disposed over a sidewall spacer of the fourth gate GA4 and the body portion is disposed over the source of the Fin FET PU1.

The various embodiments or examples described herein offer several advantages over the existing art. For example, in the present disclosure, since a local interconnect 150 is formed in a self-aligned manner, short circuits caused by process variation (e.g., alignment errors in a lithography operation) can be avoided.

It will be understood that not all advantages have been necessarily discussed herein, no particular advantage is required for all embodiments or examples, and other embodiments or examples may offer different advantages.

According to one aspect of the present disclosure, a semiconductor device includes a first gate electrode disposed on a substrate, a first source/drain region, and a local interconnect connecting the first gate electrode and the first source/drain region. The local interconnect is disposed between the substrate and a first metal wiring layer in which a power supply line is disposed. The local interconnect has a key hole shape in plan view, and has a head portion, a neck portion and a body portion connected to the head portion via the neck portion. The neck portion is disposed over the first gate electrode and the body portion is disposed over the first source/drain region.

According to another aspect of the present disclosure, a static random access memory (SRAM) includes first to sixth field effect transistors (FETs). The first FET has a first gate, a first source and a first drain. The first gate is coupled to a word line, and the first drain is coupled to a first bit line. The second FET has a second gate, a second source and a second drain. The second drain is coupled to a first power supply line. The third FET has a third gate, a third source and a third drain. The third drain is coupled to a second power supply line. The fourth FET has a fourth gate, a fourth source and a fourth drain. The fourth gate is coupled to the word line, and the fourth drain is coupled to a second bit line. The fifth FET has a fifth gate, a fifth source and a fifth drain. The fifth drain is coupled to the first power supply line. The sixth FET has a sixth gate, a sixth source and a sixth drain. The sixth drain is coupled to the second power supply line. The second gate and the third gate share a first gate electrode layer and the fifth gate and the sixth gate share a second gate electrode layer. The first source, the second source, the third source and the second gate electrode layer are electrically connected by a first local interconnect. The fourth source, the fifth source, the sixth source and the first gate electrode layer are electrically connected by a second local interconnect. The first and second local interconnects are disposed between a substrate and a first metal wiring layer in which the first and second bit lines and the second power supply line are disposed. A part of the first local interconnect, which connects the second gate electrode layer and the source of the third FET, has a key hole shape in a plan view, and has a head portion, a neck portion and a body portion connected to the head portion via the neck portion. The neck portion is disposed over the first gate electrode layer and the body portion is disposed over the source of the third FET.

In accordance with yet another aspect of the present disclosure, in a method of manufacturing a semiconductor device, a first gate structure and a second gate structure are formed over a substrate. The first gate structure includes a first gate electrode, a first cap insulating layer disposed over the first gate electrode and a first sidewall spacer disposed on side faces of the first gate electrode and the first cap insulating layer. The second gate structure includes a second gate electrode, a second cap insulating layer disposed over the second gate electrode and a second sidewall spacer disposed on side faces of the second gate electrode and the second cap insulating layer. A first source/drain region is formed in an area between the first sidewall spacer and the second sidewall spacer. A first insulating layer is formed over the first source/drain region and between the first sidewall spacer and the second sidewall spacer. After forming the first insulating layer, a part of the first cap insulating layer is removed, thereby forming a first space. A second insulating layer is formed over the first and second gate structures and in the first space. A part of the second insulating layer and a part of the first insulating layer above the first source/drain region are removed, and further a part of the first sidewall spacer is removed, thereby forming a second space over which a part of an upper surface of the first gate electrode and the first source/drain region are exposed. The second space is filled with a conductive material, thereby connecting the first gate electrode and the first source/drain region.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first gate structure and a second gate structure over a substrate, the first gate structure including a first gate electrode, a first cap insulating layer disposed over the first gate electrode and a first sidewall spacer disposed on side faces of the first gate electrode and the first cap insulating layer, the second gate structure including a second gate electrode, a second cap insulating layer disposed over the second gate electrode and a second sidewall spacer disposed on side faces of the second gate electrode and the second cap insulating layer;
   forming a first source/drain region in an area between the first sidewall spacer and the second sidewall spacer;
   forming a first insulating layer over the first source/drain region and between the first sidewall spacer and the second sidewall spacer;
   after forming the first insulating layer, removing a part of the first cap insulating layer, thereby forming a first space;
   forming a second insulating layer over the first and second gate structures and in the first space;
   removing a part of the second insulating layer and a part of the first insulating layer above the first source/drain region, and further removing a part of the first sidewall spacer, thereby forming a second space in which a part of an upper surface of the first gate electrode and the first source/drain region are exposed; and
   filling the second space with a conductive material, thereby connecting the first gate electrode and the first source/drain region.

2. The method of claim 1, wherein:
   the first and second insulating layers are made of silicon oxide, and
   the first and second cap insulating layers include at least one selected from the group consisting of SiN, SiCN, SiON and SiOCN.

3. The method of claim 2, wherein the first and second sidewall spacers are made of a different material than the first and second cap insulating layers.

4. The method of claim 3, wherein the first and second sidewall spacers include at least one selected from the group consisting of SiN, SiCN, SiON and SiOCN.

5. The method of claim 1, wherein the conductive material is made of at least one selected from the group consisting of W and Co.

6. The method of claim 1, wherein the filling the second space with a conductive material includes:
   forming a blanket layer of the conductive material; and
   performing a planarization operation such that an upper surface of the first cap insulating layer, an upper surface of the first sidewall spacer and an upper surface of the filled conductive material are flush with each other.

7. The method of claim 1, wherein, after the first space is formed and before the second insulating layer is formed, an uppermost portion of the first sidewall spacer is higher than an uppermost portion of the first gate electrode.

8. The method of claim 1, wherein, after the conductive material is formed, an uppermost portion of the first sidewall spacer is higher than an uppermost portion of the first gate electrode.

9. The method of claim 8, wherein:
   after the first space is formed and before the second insulating layer is formed, an uppermost portion of the first sidewall spacer is higher than an uppermost portion of the first gate electrode, and
   the height of the uppermost portion of the first sidewall spacer after the conductive material is formed is lower than the height of the uppermost portion of the first sidewall spacer after the first space is formed and before the second insulating layer is formed.

10. The method of claim 1, wherein:
    the removing the part of the first cap insulating layer includes:
       forming a mask pattern having an opening over the first cap insulating layer; and
       etching the part of the first cap insulating layer through the opening, and
    the opening partially overlaps the first sidewall spacer.

11. The method of claim 10, wherein the first sidewall spacer is partially etched during the etching the part of the first cap insulating layer.

12. The method of claim 10, wherein the opening partially does not overlap the first source/drain region.

13. The method of claim 1, wherein:
the removing the part of the second insulating layer and the part of the first insulating layer and the removing the part of the first sidewall spacer includes:
forming a mask pattern having an opening over the first space filled with the second insulating layer and the first source/drain region; and
etching the part of the second insulating layer, the part of the first insulating layer and the part of the first sidewall spacer.

14. The method of claim 13, wherein the opening is further over the second sidewall spacer and the second cap insulating layer.

15. The method of claim 13, wherein the opening only partially overlaps with the first space filled with the second insulating layer.

16. The method of claim 1, wherein:
the conductive material connecting the first gate electrode and the first source/drain region has a key hole shape in a plan view, and has a head portion, a neck portion and a body portion connected to the head portion via the neck portion,
the head portion is disposed over and in contact with the first gate electrode,
the body portion is disposed over and in contact with the first source/drain region and is in contact with the first and second sidewall spacers, and
a width of the neck portion measured in a first direction in which the first and second gate electrode extend in plan view is smaller than a width of the head portion and a width of the body portion, in plan view, the first direction being perpendicular to a second direction in which the first gate electrode, the first source/drain region and the second gate electrode are arranged in this order.

17. A method of manufacturing a static random access memory (SRAM) cell, the SRAM cell comprising:
a first field effect transistor (FET) having a first gate, a first source and a first drain, the first gate being coupled to a word line, the first drain being coupled to a first bit line;
a second FET having a second gate, a second source and a second drain, the second drain being coupled to a first power supply line;
a third FET having a third gate, a third source and a third drain, the third drain being coupled to a second power supply line;
a fourth FET having a fourth gate, a fourth source and a fourth drain, the fourth gate being coupled to the word line, and the fourth drain being coupled to a second bit line;
a fifth FET having a fifth gate, a fifth source and a fifth drain, the fifth drain being coupled to the first power supply line;
a sixth FET having a sixth gate, a sixth source and a sixth drain, the sixth drain being coupled to the second power supply line, wherein:
the second gate and the third gate share a first gate electrode layer and the fifth gate and the sixth gate share a second gate electrode layer,
the method comprising:
forming a first epitaxial layer over the first source and the second source, and a second epitaxial layer over the third source; and
forming a first local interconnect that electrically connects the first epitaxial layer, the second epitaxial layer and the second gate electrode layer,
wherein a portion of the first local interconnect connecting the second epitaxial layer and the second gate electrode layer has a neck portion having a width narrower than a head portion of the first local interconnect disposed over the second gate electrode layer, in a direction in which the second gate electrode extends.

18. The method of claim 17, further comprising forming a first sidewall spacer on a side face of the first gate electrode layer,
wherein the neck portion is disposed over the first sidewall spacer.

19. The method of claim 18, further comprising forming a first cap insulating layer over the first gate electrode layer, wherein the head portion is in contact with the first cap insulating layer.

20. A method of manufacturing a semiconductor device, the method comprising:
forming a first gate structure and a second gate structure over a substrate, the first gate structure including a first gate electrode, a first cap insulating layer disposed over the first gate electrode and a first sidewall spacer disposed on side faces of the first gate electrode and the first cap insulating layer, the second gate structure including a second gate electrode, a second cap insulating layer disposed over the second gate electrode and a second sidewall spacer disposed on side faces of the second gate electrode and the second cap insulating layer;
forming a first source/drain region and a second source/drain region in an area between the first sidewall spacer and the second sidewall spacer;
forming a first insulating layer over the first and second source/drain regions and between the first sidewall spacer and the second sidewall spacer;
after forming the first insulating layer, removing a part of the first cap insulating layer, thereby forming a first space adjacent to the first source/drain region with the first sidewall spacer interposed;
forming a second insulating layer over the first and second gate structures and in the first space;
removing a part of the second insulating layer and a part of the first insulating layer above the first and second source/drain regions, and further removing a part of the first sidewall spacer adjacent to the firs source/drain region, thereby forming a second space in which a part of an upper surface of the first gate electrode and the first source/drain region are exposed and a third space in which the first source/drain region are exposed; and
filling the second space and the third with a conductive material, thereby connecting the first gate electrode and the first source/drain region, and forming a contact layer over the second source/drain region.

* * * * *